United States Patent [19]
Saxon

[11] Patent Number: 5,457,458
[45] Date of Patent: Oct. 10, 1995

[54] HIGH RESOLUTION ANALOG CURRENT-TO-FREQUENCY CONVERTER

[75] Inventor: James N. Saxon, Clearwater, Fla.

[73] Assignee: Honeywell Inc., Minneapolis, Minn.

[21] Appl. No.: 387,640

[22] Filed: Feb. 13, 1995

Related U.S. Application Data

[63] Continuation of Ser. No. 171,077, Dec. 21, 1993, abandoned.

[51] Int. Cl.$^6$ .................................................. H03M 1/60
[52] U.S. Cl. ........................................... 341/157; 341/169
[58] Field of Search ................................. 341/157, 155, 341/166, 167, 168, 169, 170

[56]     References Cited
       U.S. PATENT DOCUMENTS

| | | |
|---|---|---|
| 4,228,367 | 10/1980 | Brown . |
| 4,320,390 | 3/1982 | Scott . |
| 4,594,578 | 6/1986 | Walsh ..................................... 341/157 |
| 4,616,332 | 10/1986 | Robinson et al. . |
| 4,685,614 | 8/1987 | Levine . |
| 4,841,458 | 6/1989 | Levine et al. . |
| 4,908,623 | 3/1990 | Ullestad . |
| 5,097,264 | 3/1992 | Brenner et al. . |
| 5,119,096 | 6/1992 | Marschall . |
| 5,144,309 | 9/1992 | Adams et al. . |
| 5,148,170 | 9/1992 | Leopold et al. . |

Primary Examiner—Brian K. Young
Attorney, Agent, or Firm—Thomas A. Rendos; Kenneth J. Johnson

[57]     ABSTRACT

A current-to-frequency converter which uses current balancing and pulse width modulation. An analog signal from a measurement instrument, such as an accelerometer, is integrated and transmitted to a pulse width modulator. The output from the pulse width modulator controls feedback signals which in turn control current balancing. The output of the pulse width modulating circuit is also connected to a counter which provides a digital output.

16 Claims, 5 Drawing Sheets

HIGH RESOLUTION ANALOG CURRENT-TO-FREQUENCY CONVERTER

This application is a continuation of application Ser. No. 08/171,077, filed Dec. 21, 1993 now abandoned.

FIELD OF THE INVENTION

This invention relates to analog-to-digital converters and more specifically to high resolution current balancing analog-to-digital converters.

BACKGROUND OF THE INVENTION

Analog signal to frequency converters are well known. Analog signals generated by various devices such as sensors are often converted into corresponding digital signals because of the convenience and accuracy of digital signal processing. Often the sensor is remote from the computer, therefore, the signal has to be transmitted to the computer. Accurate signal transmission with analog signals is very difficult. In order to improve the accuracy, the signal is converted into a frequency by means of an analog signal-to-frequency converter. In the digital form, the signal can be transmitted to the computer substantially without interference. In the computer, a digital word is formed out of the frequency, for example, by counting the pulses during a predetermined time. This type of transmission offers the advantage that the frequency is not disturbed by the attenuation of a transmission cable or similar influences.

A well known type of converter is the charge balanced voltage-to-frequency type. This type of converter generally includes a capacitor, connected with an operational amplifier to form a current integrator that is cyclically charged, first in one direction, second in the opposite direction (i.e., charged and discharged). This is done at a frequency which changes linearly with the input voltage applied from the sensor. The net charge applied to the capacitor during each cycle is zero, a result achieved by charging the capacitor in the first direction for a predetermined period of time. In response to the end of that time, the capacitor is charged in the opposite direction until a predetermined level is reached. The rate at which the capacitor is charged in the first direction is controlled by the sum of a current derived from the input voltage and a fixed current source. The rate at which the capacitor is discharged is determined by a current derived from the input voltage. Therefore, the frequency of the charge and discharge cycles is a direct function of the input voltage magnitude.

In another charge rebalancing scheme, an input current from the sensor builds up a charge on the capacitor for the integrator. The comparator output initiates a feedback circuit which transmits a pulse of current of the opposite polarity of the input signal to the capacitor. The number of pulses required to balance the capacitor charge is indicative of the magnitude of the sensor signal. A bit is added to the digital word output to indicate polarity of the incoming signal.

Conventional integrating current to frequency converters have not been capable of providing performance goals of linearity, symmetry and bias stability required in critical applications. One reason for the lack of accuracy of such converters is that the negative and positive current sources are unequal, or that consecutive rebalance pulses do not contain like energy. Also, bias voltages which build up across the integrator affect the accuracy of the converter. Another factor which affects the accuracy is the great amount of switching of the rebalancing current sources. In most cases, switches either absorb or add energy to the rebalance current in a non-symmetrical manner. This has an adverse effect on the linearity of the converter. In addition, the resolution of these converters is proportional to the rate at which the integrator charge is balanced. Since the non-linearity is also proportional to this rate, there is a limit to the resolution achievable.

SUMMARY OF THE INVENTION

Disclosed is a bi-directional current-to-frequency converter with an analog input and a digital signal output. The converter includes a current controlled integrator which has a non-inverting input at ground and an inverting input which receives the incoming analog signal. In response to the incoming analog signal, the current controlled integrator provides a voltage output. A pulse width modulator is in electrical contact with the current controlled integrator as well as a timer which provides timing output signals based on a system clock. The pulse width modulator outputs signal pulses whose width is dependent on the magnitude of the output voltage from the integrator. Logic gates in electrical contact with the pulse width modulator provide signals to a digital decoder which converts pulses from the pulse width modulator into a digital output. A feedback loop from the pulse width modulator provides current balancing to the inverting input of the current controlled integrator.

The converter is primarily used with sensors which have a current output proportional to the sensor input. A high output impedance for the sensor is necessary for this type of converter in order to provide current summing at the integrator input. This provides the advantage that the input voltage bias at the integrator does not contribute a charge greater than the voltage value divided by the sensor output impedance This converter has the further advantage that through the use of a pulse width modulated feedback signal to the balancing integrator, the number of transitions of the feedback signal during the conversion is minimized and remains the same for any magnitude of analog input within the set range. This greatly reduces the nonlinearity of the conversion, significantly improving the precision. Also, this converter is bi-directional in that inputs of either polarity are converted. This requires that the current sources used to balance the integrator are also bi-directional. These independent current sources are actively matched to avoid any scale factor asymmetry.

Therefore, it is an object of this invention to provide a high resolution current-to-frequency converter (20 bits).

It is also an object of this invention to minimize nonlinearity and offset errors which plague charge balancing converters.

DESCRIPTION OF THE PREFERRED EMBODIMENT

Figure 1:
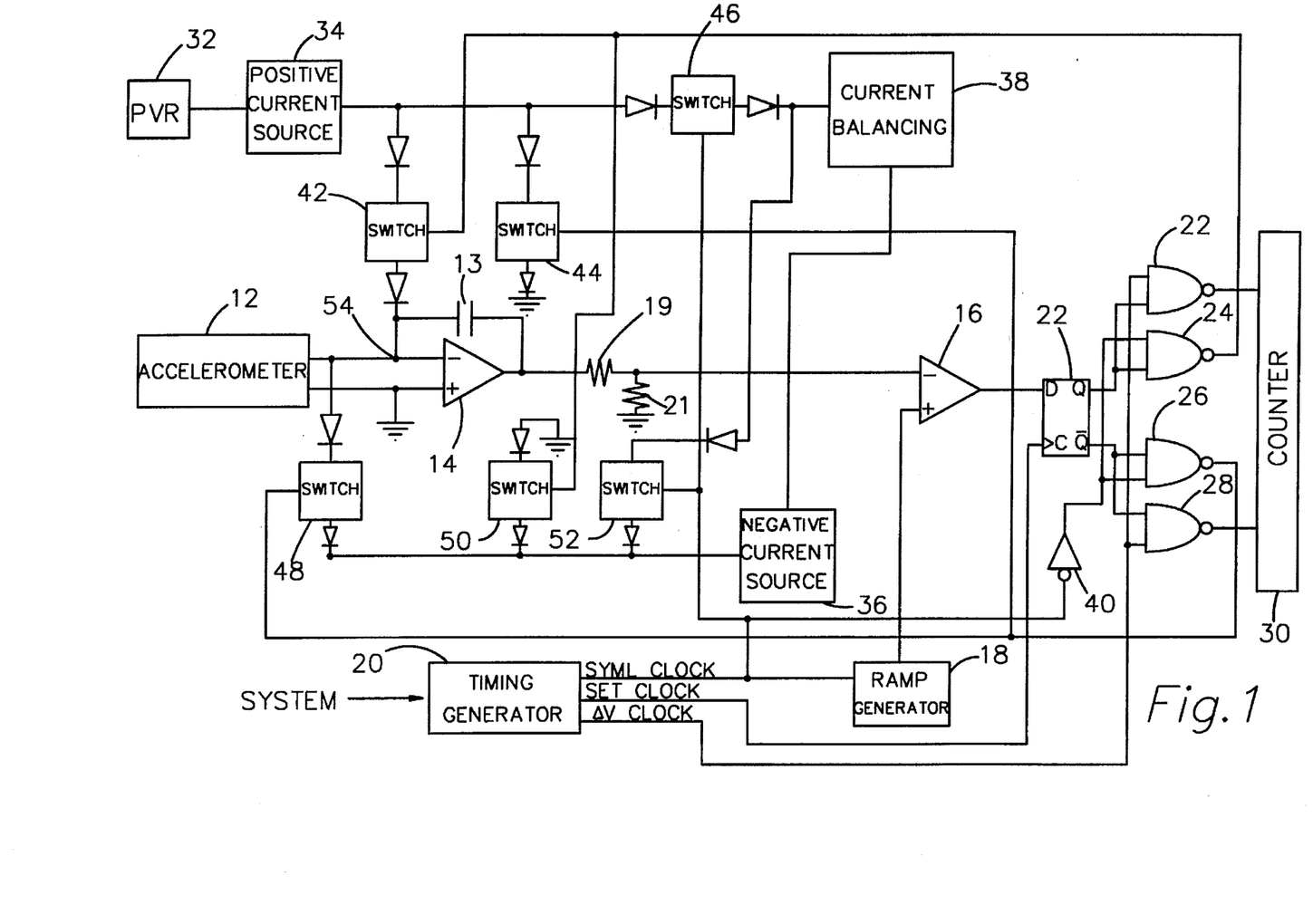
FIG. 1 shows a diagram of the analog-to-digital converter.

Disclosed in FIG. 1 is the analog-to-digital converter. An accelerometer 12 is connected to the analog-to-digital converter. The current analog signal from the accelerometer 12 is input into the inverting input of op amp 14. The non-inverting input of op amp 14 is at ground. The combination of op amp 14 and capacitor 13 creates a voltage integrator. The voltage output from the integrator is transmitted to comparator 16. The integrator voltage is compared to a ramping signal output by ramp generator 18. The signal output by comparator 16 is transmitted to flip-flop 22.

Timing generator 20 receives a clocking signal from a system clock. The timing generator outputs three timing signals, SYML Clock, Set Clock and ΔV Clock, all based on the system clock. The SYML clock signal is transmitted to ramp generator 18 as well as analog switches 52 and 46. An inverted SYML clock signal is transmitted to NAND gates 26 and 24. The Set Clock signal clocks the flip-flop 22, while the ΔV clock signal is input into NAND gates 22 and 28. Each of the NAND gates also receives an output signal from flip-flop 22. NAND gates 22 and 28 output signals to counter 30. NAND gate 24 outputs a signal to analog switches 42 and 50 while NAND gate 26 outputs a signal to analog switches 48 and 44. Analog switches 48 and 42 control current input into node 54.

Incorporated into this current-to-frequency converter is a current balancing scheme which applies either a negative or positive current at node 54 to balance against the charge built upon capacitor 13 due to the current output by accelerometer 12. Components of the current balancing circuitry are negative current source 36, current balancing electronics 38, positive current source 34, and precision voltage reference 32. Analog switches 42, 44, 46, 48, 50 and 52, provide direction for current balancing, where current may be directed either to node 54, to the current balancing electronics 38, or to ground.

Output from accelerometer 12 is a current whose magnitude is indicative of the amount of acceleration and whose polarity is indicative of its direction. This current is input into node 54 along with either negative current from current source 36 through analog switch 48, or positive current from current source 34 through analog switch 42. The inverting input of op amp 14 is the summing point for the currents from positive and negative current sources as well as the current from the accelerometer. This terminal will be at virtual ground when the sum is zero. The voltage output by the integrator is the integral of the residual from the current summing node and is known as the loop error voltage. This error voltage is scaled by resistors 19 and 21 and is input into comparator 16. As described above, the other input into the comparator is a signal output by ramp generator 18. In this embodiment of the invention, the ramping signal output by the ramp generator starts from a negative value and linearly increases to a positive value. The amplitude in this case is set to plus/minus 0.75 volts. This value was selected to avoid overdriving the comparator input. At the comparator, the ramping signal is compared to the output voltage from the integrator. Comparator 16 will output a low logic pulse while the ramping signal is less than the output voltage, and a high logic pulse while the inverse is true. The length of the low pulse in comparison to the length of the high pulse is proportional to the integrator output and thus the magnitude of the loop error voltage.

Figure 2:
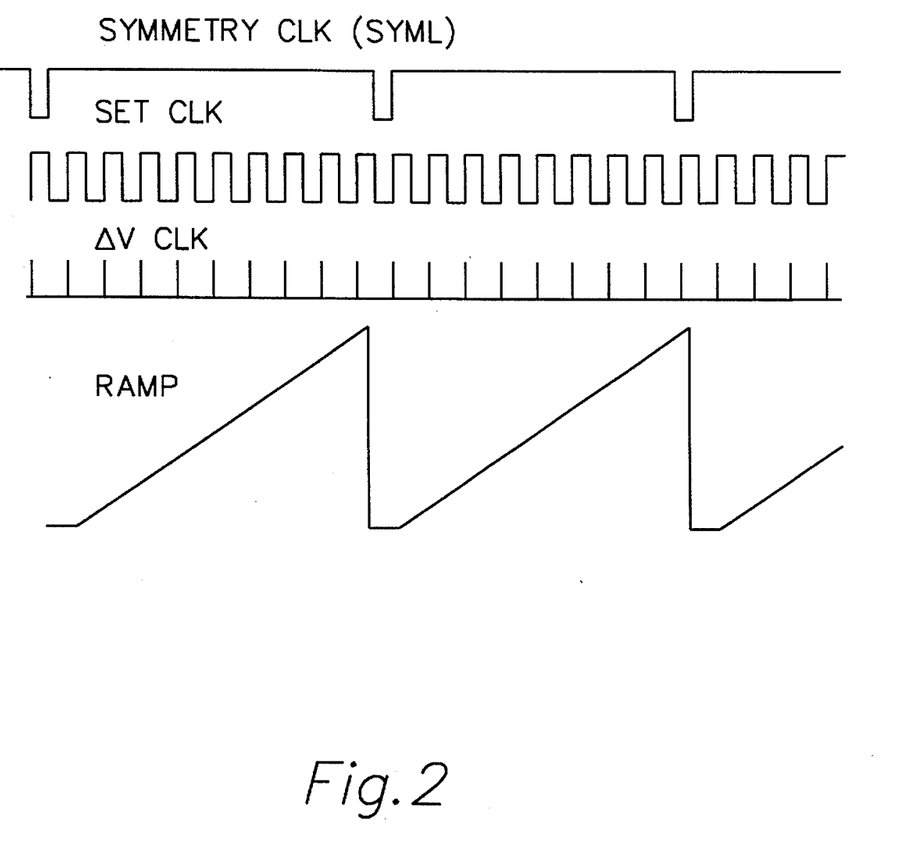
FIG. 2 shows the timing output signals and the ramping signal.

The timing generator 20 provides the clock pulses which control the loop operation and the analog to digital conversion. The SYML clocks starts the ramping signal and is used to control the dynamic matching of plus and minus current sources which will be described in more detail below. The timing generator 20 also outputs the two other clock signals. These two timing signals along with the ramping signal and the SYML clock signal are shown in the timing diagram of FIG. 2. The SYML clock signal, which controls the ramping signal, is a long pulse which is broken up by a short pulse. The duration of the short pulse in this embodiment is about 1% of the high pulse. During the time that the SYML clock signal is high, the ramping signal is output from the ramp generator 18. Once the SYML clock signal goes low, the ramp generator resets. The Set Clock signal which controls the flip-flop 22 is a series of pulses which is divisible into the length of the high pulse of the SYML signal. In this case there is a 10/1 ratio. This 10/1 ratio is used here only for clarity. For a typical application, this ratio is set to 1000/1. The ΔV signal is a series of pulses which is also divisible by the 10/1 ratio into the SYML clock signal. These pulses control the output of the NAND gates. With a 10/1 ratio between the ramp frequency and the Set Clock signal, the flip-flop 22 output can be changed in 10 discrete steps. This ratio sets the digitizer resolution. This ratio can be adjusted to provide any resolution desired. A ratio of 1000 provides 20 bits of resolution (10 bits quantization and 10 bits oversampling).

As described above, the flip-flop 22 is clocked by the Set Clock signal. The NAND gates 22 and 28 are gated by the ΔV signal and NAND gates 24 and 26 are gated by the SYML clock signal which has been inverted by inverter 40. The outputs of NAND gates 22 and 28 go to counter 30. The counter 30 then compares the number of pulses output through NAND gate 22 versus the number of pulses output by NAND gate 28 over a fixed time interval. By this count, the polarity and magnitude of the accelerometer output is determined. The magnitude can then be output as a digital word.

The output of the pulse width modulator is also used as a feedback signal to control the current summing at node 54. This feedback controls the state of several analog switches which, in turn, direct current of the proper polarity and duration as feedback to the integrator to balance the output to zero. The inverse of the SYML clock signal through NAND gates 24 and 26 controls this balancing process. The NAND gates are used to inhibit the balancing of the integrator while the SYML clock signal is low. This is the time that the ramp is reset and the two current sources are being matched. For a low output from comparator 16 and from flip-flop 22 Q output, the signal output from NAND gate 26 is low, this closes analog switch 48 and supplies a negative current to node 54. While the signal from NAND gate 26 is low, the signal from NAND gate 24 is high, which opens analog switch 42 and stops the positive current flow to node 54. The low state signal from NAND gate 26 closes switch 44 which connects the positive current source to ground in order to maintain a load on the current source. For a high output from comparator 16, the signal output from NAND gate 24 is low and the signal output from NAND gate 26 is high, analog switch 42 is turned on and a positive current source is supplied. The low signal from NAND gate 24 turns on switch 50 which connects the negative current source 36 to ground. These currents are supplied in this manner to provide servo loop closure.

In order for this type of current balancing scheme to operate properly, it is necessary to match the magnitude of the two current sources. This matching is necessary in a binary loop due to the inability to separate scale factor asymmetry from bias. Current equalizing circuitry 38 has been provided in order to match the magnitudes of the current sources. In this case, the current sources can be matched within one part per million with no trimming or compensation. This equalizing can be better understood by a study of FIG. 3.

Figure 3:
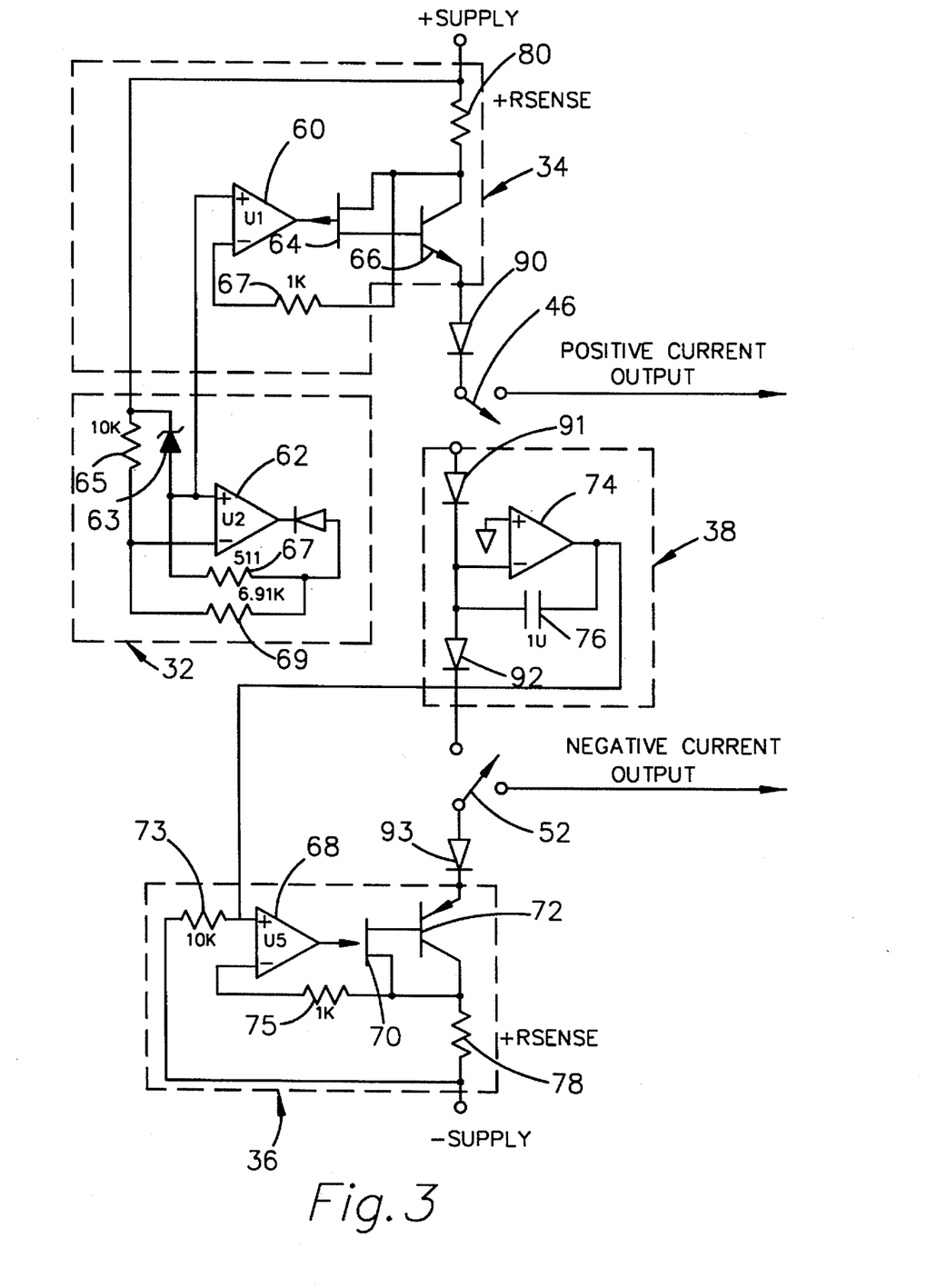
FIG. 3 shows a diagram of the current balancing circuit.

In FIG. 3, the components of positive current source 34, negative current source 36, and the elements of the current balancing circuit 38 are shown. In this particular embodiment, the positive current source with precision voltage reference 32 acts as the master while the negative current acts as the slave. The precision voltage reference 32 consists of op. amp 62, precision zener 63, 10k ohm resistor 65, 511 ohm resistor 67, and 6.19 k ohm resistor 69. The circuit provides a precision voltage, which is the voltage across the zener 63, to the positive current source 34. Precision voltage reference 32 is a commonly used circuit which provides a nearly constant bias current to the zener 63 despite variations in supply voltage. A simple example using the present embodiment will illustrate this.

With a positive supply at +15 V, the potential at the op.amp 62 positive input will be +8.8 volts. This assumes a perfect 6.2 volt zener. The potential at the negative input will be the same after the stage converges. The current through the 10 k ohm resistor is then 6.2 V/10K=0.00062 amps and the drop across the 6.19K is 3.8378 volts. This drop is also across the 511 ohm resistor and the zener bias current is 7.510372 milli amps. This is the ideal bias for minimum temperature sensitivity for the zener 63. With a supply variation of –10% (+13.5 volts) the voltage at the op amp inputs changes to +7.3 volts but since the drop across the 10K ohm resistor is still 6.2 volts and the current through the 6.19K ohm resistor is unchanged, the current through the 511 ohm resistor (and the zener) is also unchanged. This shows that the preferred embodiment of the precision voltage reference is insensitive to supply variations of less than 10%.

The positive current source 34 receives the output of precision voltage reference at the positive input of op amp 60. This voltage is –6.2 volts with respect to the positive supply. The negative input to the op amp will be the same with a voltage drop across the +RSENSE 80 of 6.2 volts. RSENSE 80 is a variable resistor and the magnitude of the positive current is controlled through adjustment of its magnitude. The 1K resistor provides the feedback to the negative input. The P channel JFET 64 and the NPN transistor 66 act as a power stage. This stage provides a very high output impedance due to the operation of the JFET 64 with the drain connected to the base of the NPN 56. This arrangement prevents the disturbance of the JFET gate to source voltage by load variation.

The negative current source 36 operates similar to the positive current source 34 but with a control voltage input from the current equalization circuit 38. This control voltage is nominally +6.2 volts with respect to the negative supply. Again, the current is determined by the value of the –RSENSE resistor 78. The power stage uses a N channel JFET 70 and a PNP transistor 72. The JFET 70 drain is connected to the PNP base to achieve high output impedance.

The current equalization circuit 38 and the switches 46 and 52 act as a sample and hold. The switches 64 and 52 close simultaneously for a short period to direct the positive and negative current outputs to the integrator which consists of op amp 74 and capacitor 76. The negative input to the op amp 74 is the summing node. The positive input is at ground and as the circuit nulls the negative input will be at ground potential also. This null position will be with the op amp output at +6.2 volts with respect to the negative supply. This is true when both the +RSENSE and the –RSENSE are equal. With a 1 μf capacitor 76, a current source of 0.04 amps, and a sample period of 1 μsec the circuit will reach equilibrium 220 samples after initial turn on. This is from dt=Cdv/I where C is capacitance, dt is time, I is current and dv is the change from zero to the final voltage. This final voltage will be –8.8 volts (–15+6.2). The capacitor actually charges 0.04 volts during each sample.

When the switches are open to the current equalization circuit 38 (closed to the outputs), the circuit is in the hold state with only op amp bias current and switch leakages to affect the stored charge. These are small with the usage of FET input op amp and JFET switches. Even these currents are of no consequence if they are constant since they cause only a constant difference in the positive and negative current outputs of the two sources which can be accommodated by measuring this difference and using a compensation scheme.

The diodes in series with the switches are not necessary for circuit operation. However, they do improve overall performance by providing a constant load to the current sources of two diodes to ground. This is the same load the sources see when in the hold state. The diode in series with the op amp output in the precision voltage reference circuit insures that the circuit turns on in the proper state with the zener reference properly biased.

As can be seen FIG. 1, the six analog switches control the direction of the current. The current from the positive and negative current sources may be either switched into node 54, to ground, or into the current equalizing circuitry. In most current-to-frequency converters there is a need for an analog switch that will operate with a digital interface and transition from the on to off state or off to on state within 5 nanoseconds. The typical switching speed for integrated microcircuits is approximately 100 nanoseconds. Fast analog switching improves the linearity of the analog-to-digital converter by significantly reducing switching errors.

Figure 4:
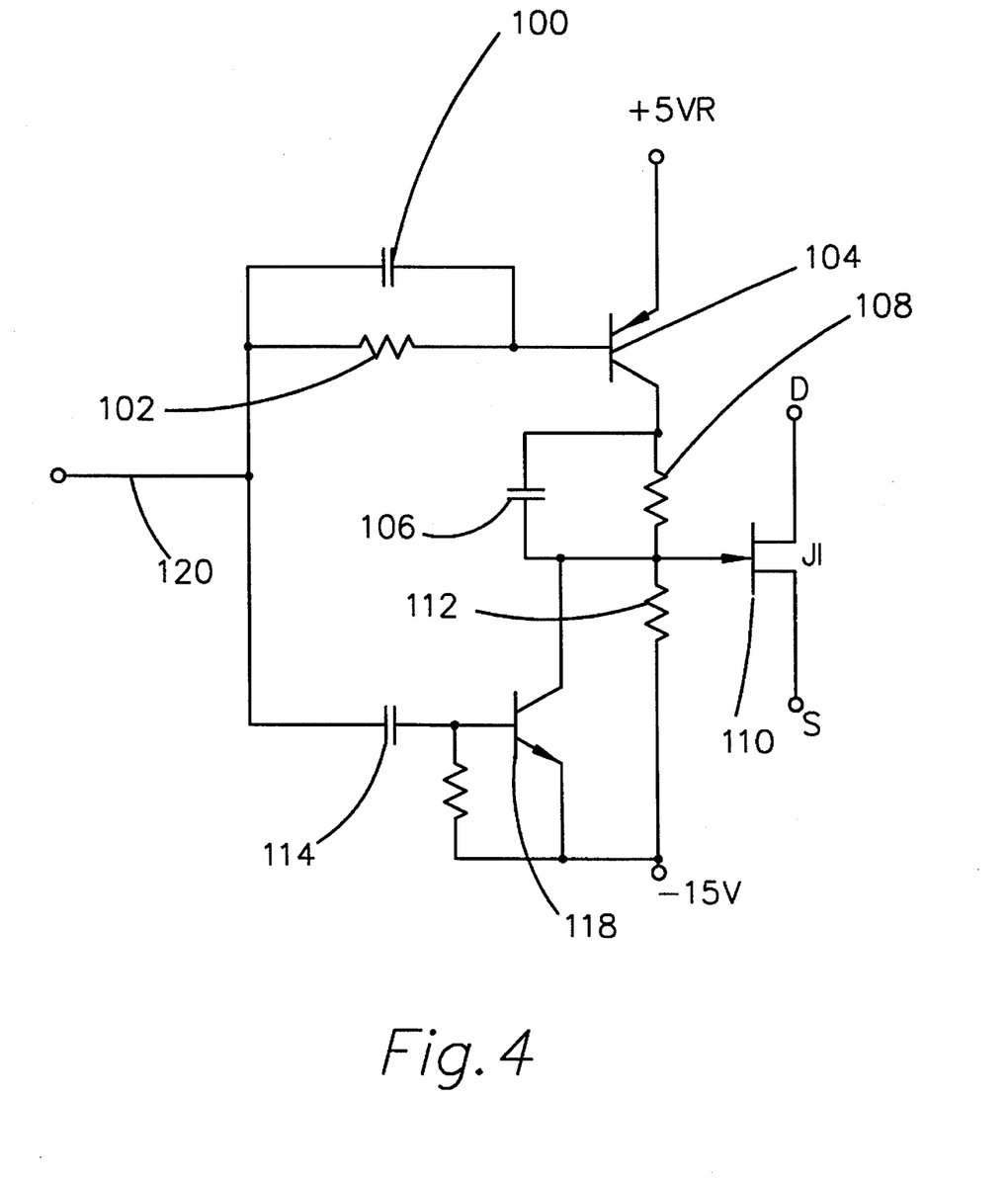
FIG. 4 shows a diagram of the analog switch.

FIG. 4 shows the preferred embodiment of the analog switch. The circuit is comprised of a JFET 110, which is the on/off switching element. The remainder of the circuit is a driver to interface the gate of JFET 110 to the logic input signal at terminal 120.

The driver circuitry operates in static and transients states to hold the gate of JFET 110 at –15 volts for switch off and at approximately –2.2 volts for switch on. This is accomplished for the static state by the resistors 108 and 112 and PNP transistor 104. When the input logic signal is high, transistor 104 will be off and the gate of the JFET will be at –15 volts and the switch is off. When the input logic signal is low then the +5VR will provide base drive and turn transistor 104 on. This will place approximately +5 volts at the top of resistor 108 and approximately –2.2 volts at the gate of the JFET and the switch will be on. These are the conditions for the switch static on/off states. The remainder of the circuitry is used for transient turn on and off of the switch.

The primary obstacle to fast switching a JFET is the gate capacitance which must be charged before the gate to source voltage can be changed in order to change the on/off state. This is accomplished in this circuit by providing low impedance paths for charge and discharge to minimize the time. The gate turn on low impedance path is via capacitor 106 and transistor 104. The turn off path is via transistor 118.

The next obstacle to overcome to obtain fast gate switching is the relative long turn off time of the bipolar transistor 104. This is accomplished by utilizing the turn on of transistor 118. The turn on time of bipolar transistors is considerably faster than their turn off time. This characteristic is used to advantage here. When the input signal goes high to turn the switch off, transistor 118 begins turn on and transistor 104, begins turn off. Both actions will lead a gate voltage at JFET 110 of −15 volts. As transistor 118 turns on the gate capacitance is rapidly charged to the −15 volts even though transistor 104 is still on. Transistor 118 will remain in the on state until after transistor 104 has fully turned off. This action is accommodated by the capacitor 114 which provides fast transistor 118 base drive for the transistor turn on. It also sets the duration of the transient interval.

The fast turn on of the switch is accomplished by the fast turn on of transistor 104 which occurs as the logic input signal goes to the low (approximately +0.7) volts) state. This action is enhanced by capacitor 100 which provides the fast base drive for this transistor. The action is also enhanced by capacitor 106 which as stated above provides a low impedance path for charging the JFET 110 gate capacitance as transistor 104 turns on.

Figure 5:
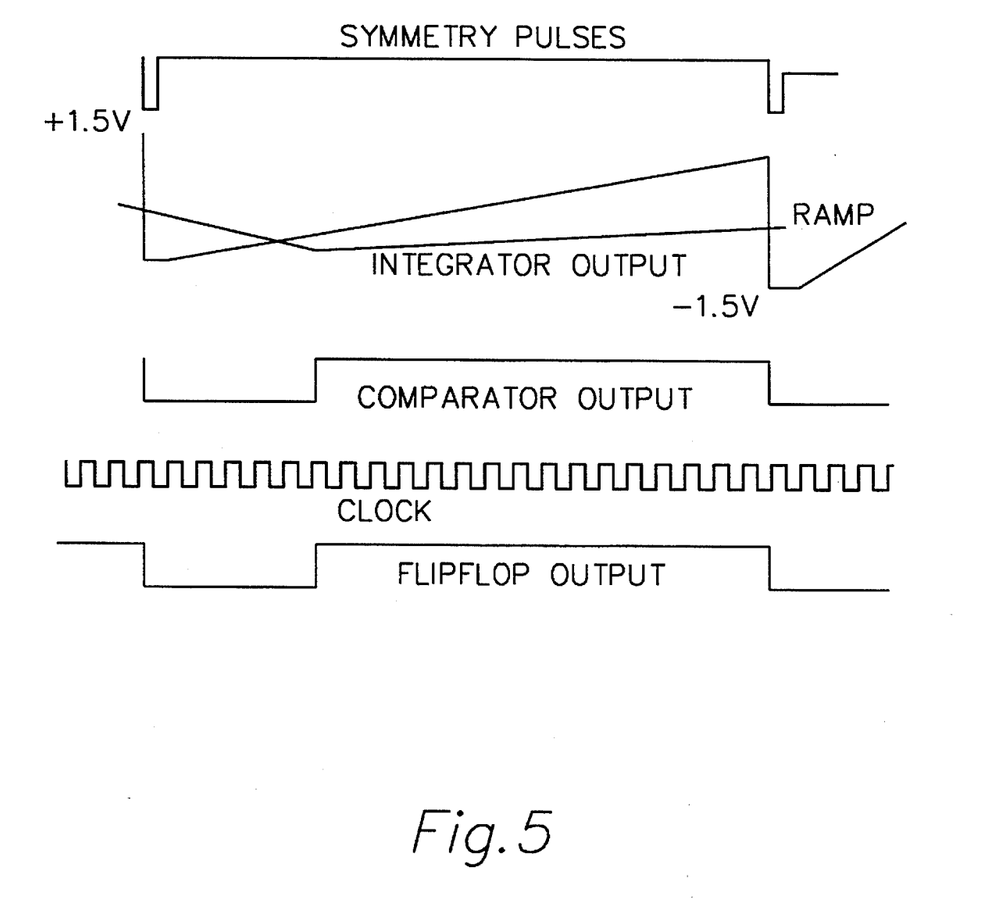
FIG. 5 shows a control diagram of selective signals in the analog-to-digital converter.

The operation of the present invention can be better understood by study of the control diagram in FIG. 5. Included in the diagram are a variety of output signals from within the converter. Shown are the SYML clock signal, the integrator output superimposed on the ramp signal, the comparator 16 output, the Set Clock signal, and the signal output by flip-flop 22. At the first rising edge of the SYML clock signal, the ramp generator begins outputting its ramping signal. During this time the integrator is outputting a voltage signal which is indicative of the magnitude of the loop error. At the beginning of the SYML clock pulse, the integrator output will be greater than the ramping signal. In response, a low signal is output by the comparator which is in turn reflected by the flip-flop output after it has been clocked in by the Set Clock signal. At a particular point during the SYML pulse, the integrator output becomes less than the ramping signal, the comparator switches high and the flip-flop output in turn switches high after being clocked. The high flip-flop Q output has the effect of turning the output of NAND gate 26 high and the output of NAND gate 24 low. When the output of NAND gate 26 is high, analog switch 48 is open and negative current is not allowed to flow to node 54. The output of NAND gate 24 is low and this turns on analog switches 42 and 50 which has the effect of allowing positive current to flow to node 54 and negative current to flow to ground. For the case when the ramping signal is less than the integrator output, negative current will be directed to node 54 while positive current will be directed to ground. This alternation of positive and negative current to node 54 provides current balancing at the inverting input of op amp 14.

The flip-flop 22 output is symmetrical with zero accelerometer input. As the input becomes non-zero, the symmetry of the flip-flop out will change in 10 microsecond steps for this embodiment. This step causes a discrete change in the rebalance current applied to the integrator and constitutes a velocity measurement of this resolution for which an information pulse is output to the counter. This resolution is set by the frequency of the Set Clock Signal and can be changed to fit the requirements of the application.

The time quantization and the resulting resolution is controlled by the set clock and the D type flop-flop, the output of which changes on the positive clock edge. It is seen that the symmetry of this output can change in ten discrete steps. For each step change, a voltage error pulse will be generated in the counter where the difference in the number of positive voltage error pulses and negative voltage error pulses are differenced. For a zero input, the number of positive voltage error pulses and negative voltage error pulses will be equal.

Between the times when the ramp signal is generated, there is an interval when the SYML clock signal is low. For this embodiment of the invention, it is about 1% of the time. This short low pulse switches off analog switches 42, 44, 48 and 50, and switches on analog switches 46 and 52. During this time, the current from the two current sources is equalized. As was described above, current from both the negative current source 36 and the positive current source 34 flows into the current equalizing circuitry 38 and the integrator within that circuitry feeds back to the negative current source and equalizes the two current sources. Once the SYML clock pulse goes high, switches 52 and 46 turn off and the circuit continues its analog-to-digital conversion.

The primary advantage of this invention is to achieve high resolution while maintaining good linearity of the input to output transfer. That is to say that the polynomial equation describing the transfer has no terms higher than first order. This linearity is achieved by limiting the error due to the switching transient of the analog switches. This is achieved by operating the loop closure at a low frequency (the ramp rate) while quantizing the analog to digital conversion at a high rate (the set clock rate). This circuit also keeps the number of switching transients constant over the full input range.

The foregoing is a description of a novel and non-obvious analog-to-digital converter. The applicant does not intend to limit the invention through the foregoing description, but instead to define the invention through the claims appended hereto.

I claim:

1. An analog-to-digital converter with an analog input and a digital signal output comprising:

current controlled integrating means having a non-inverting input at ground, an inverting input for receiving an analog signal over the analog input, and a voltage output;

timing means which receives a system clock signal and outputs a plurality of timing signals which are dependent on cycles of the system clock;

a ramp signal generating means which cyclically outputs a ramping signal in response to one of the plurality of timing signals;

comparing means which compares the output voltage and the ramping signal and outputs a pulse with a width proportional to the magnitude of the analog signal;

switching means which receives the pulse from the comparator means and is in electrical contact with said timing means;

feedback means connected to said switching means for providing positive or negative current balancing pulses at the inverting input of said current controlled integrator such that over time a residual charge left on the integrating means is indicative of the magnitude of the analog signal; and digital encoding means connected to said switching means for converting the pulse output from said comparator means through said switching means into a digital output.

2. The analog-to-digital converter of claim 1, wherein the feedback means includes negative and positive current sources which are activated by said switching means.

3. The analog-to-digital converter of claim 2, wherein means are provided to continually equalize the negative and positive current sources during operation of the analog-to-digital converter.

4. The analog-to-digital converter of claim 3, wherein the plurality of timing signals provide control for said ramping signal generator, said switching means and the negative and positive current sources.

5. The analog-to-digital converter of claim 4, wherein the frequency of the plurality of timing signals affects the resolution of the analog to digital converter.

6. An analog-to-digital converter comprising;

an input for an analog signal;

a current controlled integrator with a non-inverting input at ground, an inverting input which receives said analog signal, and an output voltage;

a timing generator which receives a system clock signal and outputs a plurality of timing signals which are dependent on the system clock signal;

a ramp signal generator which cyclically outputs a ramping signal in response to a signal from said timing generator; and comparator which compares the output voltage and the ramping signal and outputs a pulse with a width proportional to the magnitude of the analog input:

a plurality of switches in contact with said comparator and said timing generator;

a feedback circuit in connection with the electronic switches for providing current balancing at the inverting input of said current controlled integrator; and digital encoder connected to said switches for converting the pulse into a digital output.

7. The analog-to-digital converter of claim 6, wherein the feedback circuit includes negative and positive current sources which are activated by said switches.

8. The analog-to-digital converter of claim 7, wherein means are provided to equalize the negative and positive current sources during operation of the analog-to-digital converter.

9. The analog-to-digital converter of claim 8, wherein the plurality of timing signals provides control for said ramping signal generator, said plurality switches, and the means for equalization of the negative and positive current sources.

10. The analog-to-digital converter of claim 9, wherein the frequency of the plurality of timing signals affects the resolution of the analog-to digital-converter.

11. The analog-to-digital converter of claim 1 wherein the analog input is from an accelerometer.

12. The analog-to-digital converter of claim 11 wherein the analog-to-digital converter provides the digital output for both negative and positive accelerations.

13. The analog-to-digital converter of claim 6 wherein the analog input is from an accelerometer.

14. The analog-to-digital converter of claim 13 wherein the analog-to-digital converter provides the digital output for both negative and positive accelerations.

15. A method of analog-to-digital conversion comprising the steps of:

receiving an analog signal;

integrating the analog signal so as to generate a first ramping signal with a slope proportional to the analog signal magnitude;

providing a second ramping signal of known slope which periodically resets and begins again after reaching a predetermined magnitude;

comparing the first and second ramping signal during the predetermined period time and generating a first pulse width while the first ramping signal is greater than the second ramping signal and generating a second pulse width while the first ramping signal is less than the second ramping signal;

translating the first and second pulse widths into a digital output indicative of the magnitude and polarity of the analog signal; and periodically adding pulses of negative and positive current to the analog signal to provide current balancing for integration of the analog signal, where the addition of the positive and negative current is controlled by the size of the first and second pulse widths.

16. The method of analog-to-digital conversion of claim 15 further comprising the step of periodically equalizing the positive and negative currents.

* * * * *